(12) United States Patent
Uzoh

(10) Patent No.: US 6,429,519 B1
(45) Date of Patent: *Aug. 6, 2002

(54) WIRING STRUCTURES CONTAINING INTERCONNECTED METAL AND WIRING LEVELS INCLUDING A CONTINUOUS, SINGLE CRYSTALLINE OR POLYCRYSTALLINE CONDUCTIVE MATERIAL HAVING ONE OR MORE TWIN BOUNDARIES

(75) Inventor: Cyprian E. Uzoh, Dutchess, NY (US)

(73) Assignee: International Business Machines Corporation, Armonk, NY (US)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/277,699

(22) Filed: Mar. 26, 1999

Related U.S. Application Data

(62) Division of application No. 08/838,222, filed on Apr. 3, 1997, now Pat. No. 5,930,669.

(51) Int. Cl.[7] ............................................. H01L 23/48
(52) U.S. Cl. ..................................... 257/758; 257/774
(58) Field of Search ..................... 438/661; 251/758, 251/774

(56) References Cited

U.S. PATENT DOCUMENTS

| | | | |
|---|---|---|---|
| 4,717,462 A | 1/1988 | Homma et al. | 209/298.06 |
| 4,789,648 A | 12/1988 | Chow et al. | 438/633 |
| 5,006,484 A | 4/1991 | Harada | 438/620 |
| 5,051,812 A | 9/1991 | Onuki et al. | 257/758 |
| 5,081,064 A | 1/1992 | Inoue et al. | 438/625 |
| 5,082,802 A | 1/1992 | Gelsomini | 438/107 |
| 5,093,710 A | 3/1992 | Higuchi | 257/764 |
| 5,192,714 A * | 3/1993 | Suguro et al. | 437/195 |
| 5,312,775 A | 5/1994 | Fujii et al. | 438/625 |
| 5,385,868 A | 1/1995 | Choa et al. | 438/637 |
| 5,629,236 A * | 5/1997 | Wada et al. | 438/607 |
| 5,744,376 A | 4/1998 | Chan et al. | 438/643 |
| 5,783,282 A | 7/1998 | Leiphart | 428/138 |
| 5,817,572 A * | 10/1998 | Chiang et al. | 438/624 |
| 5,821,168 A | 10/1998 | Jain | 438/692 |

FOREIGN PATENT DOCUMENTS

| | | |
|---|---|---|
| JP | 3011737 A | 1/1991 |
| JP | 5251566 A | 9/1993 |
| JP | 6045332 A | 2/1994 |

OTHER PUBLICATIONS

Callister, "Materials Science and Engineering, an Introduction, 3rd Edition", John Wiley & Sons, 1994, pp. 78–79.*

* cited by examiner

Primary Examiner—Kevin M. Picardat

(57) ABSTRACT

The present relates to a method of fabricating wiring structures which contain a continuous, single crystalline conductive material extending through the structure. This is achieved in the present invention by utilizing an open-bottomed via liner structure.

17 Claims, 8 Drawing Sheets

WIRING STRUCTURES CONTAINING INTERCONNECTED METAL AND WIRING LEVELS INCLUDING A CONTINUOUS, SINGLE CRYSTALLINE OR POLYCRYSTALLINE CONDUCTIVE MATERIAL HAVING ONE OR MORE TWIN BOUNDARIES

RELATED APPLICATION

This application is a divisional application of U.S. Ser. No. 08/838,222, filed Apr. 3, 1997 now U.S. Pat. No. 5,930,669.

FIELD OF THE INVENTION

The present invention relates to the use of a continuous highly conductive metal wiring structure in fabricating various semiconductor devices. More specifically, the present invention relates to a method of fabricating a wiring structure comprising a continuous single crystalline or polycrystalline conductive metal material extending through the structure which eliminates any interfaces between vias and lines contained within the structure. Damascene and non-damascene wiring structures are also provided by the present invention.

BACKGROUND OF THE INVENTION

A semiconductor chip contains an array of devices whose contacts are interconnected by patterns of conductive wires. In order to take full advantage of the device and the circuit density on a given chip, it is usually necessary to make interconnections among the various devices and circuit elements in the chip. However, due to the level of integration of devices and circuits on a chip, interconnections can no longer be made by means of a single level network of conductive lines. Often, it is necessary to form two or more such levels of conductive lines which are vertically spaced apart and separated by intermediate insulating layers.

Connections can be made between the different levels of conductive lines by means of vias which are etched through the insulating layer separating the levels. These vias are filled with a metal to form via studs. These multiple levels of conductor wiring interconnection patterns, with the individual levels connected by via studs, operate to distribute signals among the circuits on the chip.

In its simplest form, a via may be made by first masking an insulating layer with a photoresist and then selectively etching a portion of the insulating layer. The via is etched through an opening formed in the photoresist using well known photolithographic techniques to form an opening to the underlying conductive layer. Depending on the aspect ratio and the interconnection ground rules, isotropic or anisotropic etching processes may be used to form a hole in the dielectric.

After via etching, and photoresist removal, it is essential to deposit a conductive layer in the via. This deposited conductive layer forms an electrical interconnection between the conductive layers of the device. However, a liner or barrier layer is usually desirable between the insulative and conductive layers.

The presence of a liner layer on the sidewalls on the via is desirable because it enhances the structural integrity of the entire laminate. A good liner or barrier film effectively isolates the conductive metal from the dielectric as well as adhering firmly to the conductive metal and the dielectric. However, the best liner materials tend to be more resistive, as compared to conductive materials, so the presence of the liner at the bottom of the via increases the contact resistance of the structure. An increase in contact resistance is not desirable because it may lead to slower propagation of electrical signals through the wiring structure. For structural integrity, the liner should line the entire sidewall and will generally cover the bottom of the via as well.

Materials capable of forming a liner layer generally have a higher resistance than conductive materials. Liner materials have generally been selected to simultaneously minimize contact resistance, provide adequate adhesion between insulative and conductive materials, and provide a good diffusion barrier.

The contact resistance problem is compounded when copper, Cu, is used as the conductive metal. When Cu is used, the presence of a continuous dissimilar liner material with comparatively higher resistivity at the bottom of the via deters the fabrication of a single crystalline, or continuous, interface between the via conductor material and the wiring level below.

The formation of a single crystalline or polycrystalline interface in wiring structures is advantageous since it provides greater structural integrity for the interface between the via and the wiring level below. In the prior art, after via definition over a metal line, typically a continuous liner or barrier film is deposited on the sidewalls and bottom of the via. This is then followed with seed layer deposition over the liner. Finally, the via is filled with a metal using a suitable deposition method such as electroplating, CVD, electroless deposition or PVD techniques. In prior art wiring structures, the vias and lines are separated by a liner film; therefore an interface exists between the vias and the lines of the wiring structure.

A typical prior art wiring structure is shown in FIGS. 1(a)–(b). Specifically, FIG. 1(a) shows a typical via level 50 on a planarized metal level 52. Via 50 consists of an opening in the dielectric that is landed on metal level 52. The prior art via structure comprises a continuous liner layer 50c, a seed layer 50b and a conductive metal 50a. An interlevel dielectric 54 separates via level 50 from metal level 52. After metal planarization, a plane of the liner layer 50c remains at the interface of the via and the trench.

In view of the drawbacks mentioned hereinabove, there remains a need of fabricating semiconductor devices which contain a continuous, single crystalline or polycrystalline conductive material, particularly Cu, between the various wiring levels of the semiconductor device.

SUMMARY OF THE INVENTION

It is an object of the present invention to provide a method of fabricating a semiconductor device which contains no barrier material at the interfaces of the various wiring levels of the semiconductor device.

It is a further object of the present invention to provide a semiconductor device containing a continuous conductive metal microstructure running between lines and vias of the device which has an extremely low or relatively non-existent contact resistance compared with prior art devices.

It is another object of the present invention to provide a method of fabricating semiconductor devices in high yield having reduced maze or line resistance and having superior electromigration.

These as well as other objects will be achieved in the present invention by using an open-bottomed via liner structure in the semiconductor device. Specifically, the foregoing objects are met by the method of the present invention which comprises the steps of:

(a) providing an open-bottomed via liner structure comprising at least one via level located on top of at least one metal level, said via level having a liner material deposited only on the via's sidewalls;

(b) depositing a layer of conductive material to the open-bottomed via structure provided in step (a);

(c) forming a metal line layer on the conductive material;

(d) annealing said metal line layer under conditions effective to form a continuous, single crystalline or polycrystalline conductive material extending through the lines and vias of the structure; and (e) planarizing the structure provided in step (d).

In one embodiment of the present invention, the structure provided in step (c) is encapsulated in a metal such as Ta, TaN, TiN, W, SiN and the like prior to annealing. Diamond-like carbon may also be used as an encapsulating material.

In another embodiment of the present invention, the annealing step is not performed. This is typically done when multilevel wiring structures are desirable.

The open-bottomed via liner structure employed in the present invention can be fabricated using conventional methods well known to those skilled in the art, but typically it is fabricated by the following steps:

(i) providing a planarized wiring structure having at least one metal level and at least one trench, wherein said trench contains a first liner material and is filled with a trench material;

(ii) optionally, depositing an interlevel dielectric layer on said metal level;

(iii) depositing an insulative material on said interlevel dielectric layer or said metal level;

(iv) patterning said insulative material to provide a via therein; and (v) sputter depositing a second liner material to said via under conditions effective to cause deposition on said insulative material and on the via's sidewalls.

DETAILED DESCRIPTION OF THE PRESENT INVENTION

Figure 1:
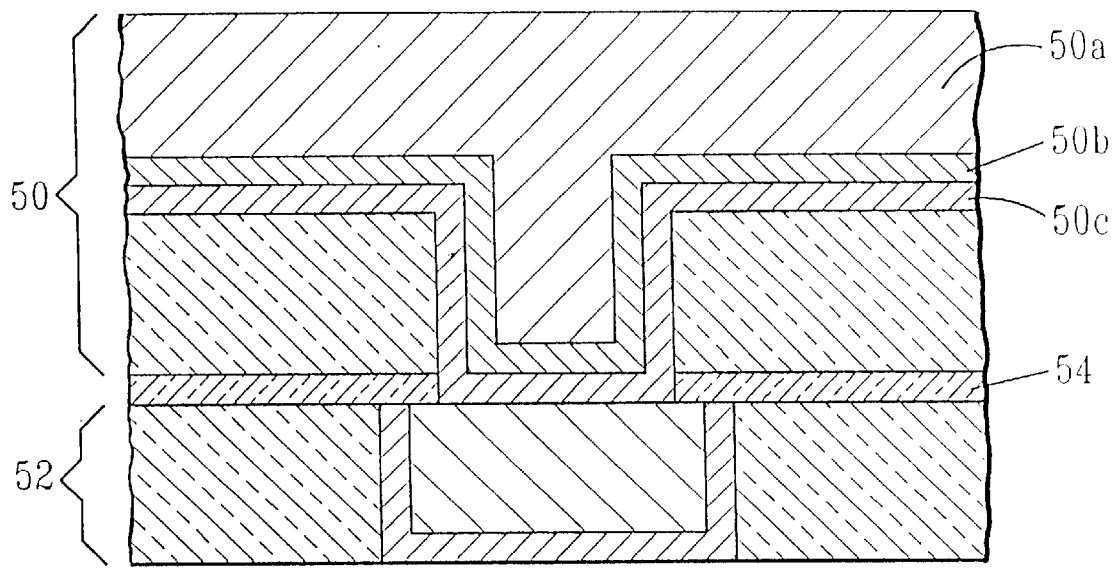
FIGS. 1(a)–(b) are cross-sectional views of a wiring structure of the prior art.
Figure 1:
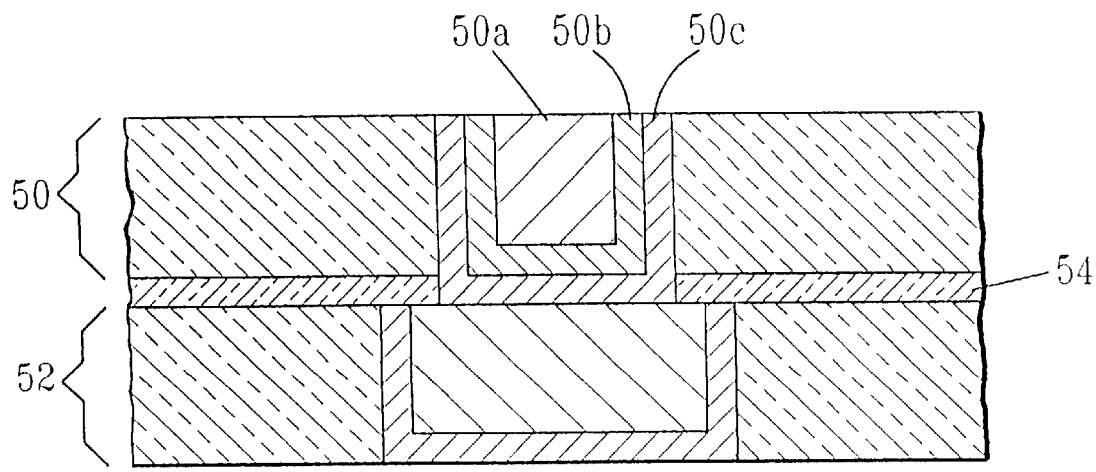

The present invention, which relates to the use of an open-bottomed via liner structure in fabricating semiconductor devices, will now be described in more detail by referring to the drawings that accompany this specification. It should be noted that in the drawings like elements or components will be referred to be like numerals.

Figure 2A:
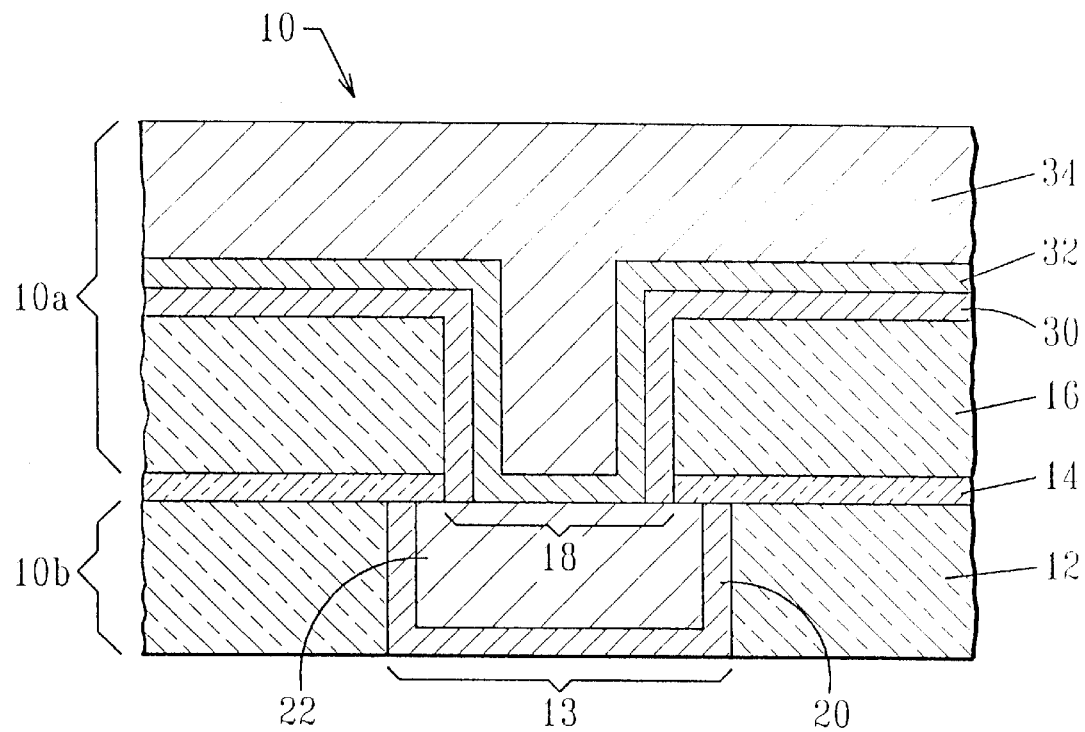
FIGS. 2(a)–(c) are cross-sectional views of a wiring structure prepared in accordance with the present invention.
Figure 2B:
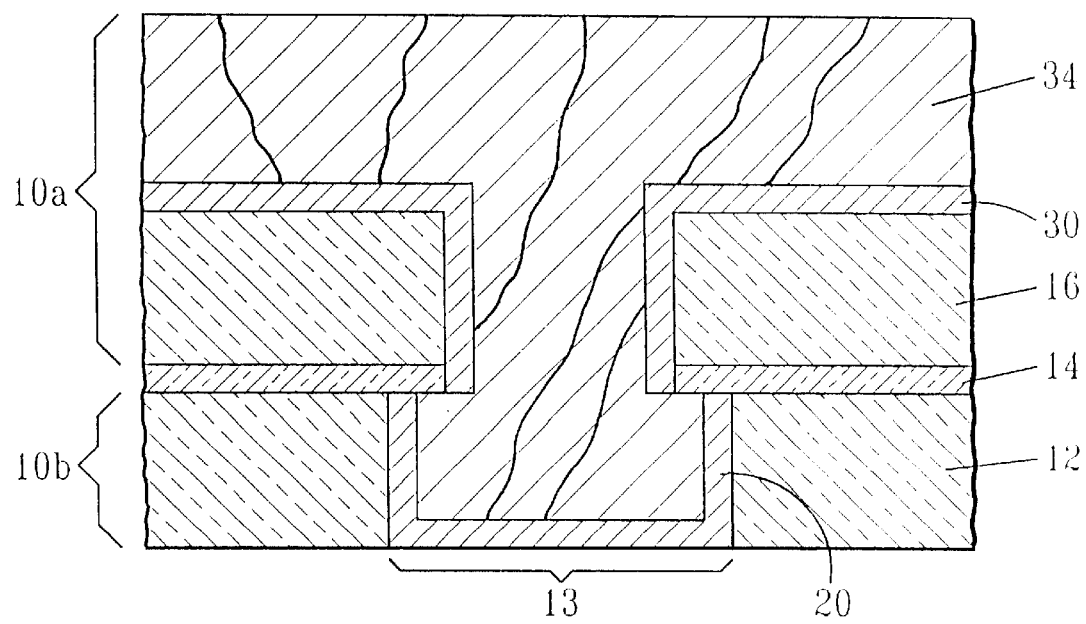
Figure 2:
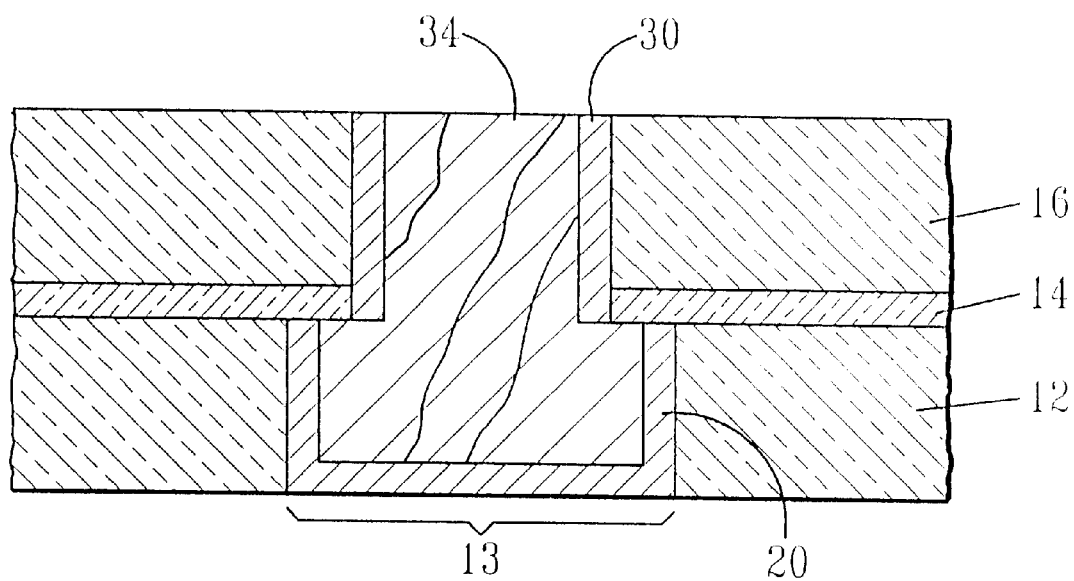

Referring to the drawings in more detail, and particularly referring to FIGS. 2(a)–(c), there is shown the various processing steps that are employed in the present invention for forming a wiring structure containing a continuous, single crystalline conductive material extending through the structure.

Specific attention in this regard is first directed to FIG. 2(a), which shows a typical planarized wiring structure that is employed in the present invention. Specifically, FIG. 2(a) shows a planarized wiring structure 10 which comprises at least one via level 10a on top of at least one metal level 10b. The metal level 10b includes at least one insulative portion 12 and at least one trench 13 or metal line. Trench 13 contains a liner material 20 on the sidewalls and the bottom of trench 13, and is filled with a trench material 22. Via level 10a of the wiring structure comprises at least one via 18 and an insulative material 16. Moreover, via level 10a and metal level 10b are typically separated by interlevel dielectric layer 14. In certain embodiments, it is not necessary to have interlevel dielectric layer 14 separating via level 10a and metal level 10b.

It should be noted that liner material 20 shown in FIG. 2(a) is a continuous liner covering the sidewalls and the bottom of trench 13. A discontinuous liner covering only portions of the sidewalls of the trench may also be employed in the present invention. Suitable materials that may be employed in the present invention as liner 20 include, but are not limited to, Al, Cr, Ti, TiN, W, Ta, TaN, TaN/Ta, Ta/TaN, Ta/TaN/Ta, TaN/Ti, Ta—Ti alloy, Ta—Cr alloy and Ti—Ta—Cr alloys.

The trench materials employed in the present in forming region 22 are conventional conductors well known to those skilled in the art. Examples of such conductors include, but are not limited to, Cu, Al, Ag, Cr, Au, Ni, W and the like. Alloys containing one or more of these metals are also contemplated herein.

The other elements shown in FIG. 2(a), i.e. interlevel dielectric 14 and insulative layers 12 and 16, are also composed of conventional materials. For example, interlevel dielectric 14 and insulative layers 12 and 16 may be composed of $SiO_2$, spin on glasses, $TiO_2$, $(Ba,Sr)TiO_3$, organic polymers, inorganic polymers, fluorinated polymers, $TiO_3$, and the like. Depending on the device being fabricated, layers 12, 14 and 16 may be composed of the same or different material.

The via level of the wiring structure shown in FIG. 2(a) is fabricated using techniques well known to those skilled in the art. For example, it can be manufactured by etching, e.g. reactive ion etching (RIE), via 18 in insulative material 16; depositing a liner material and then a conductive material by sputtering, chemical vapor deposition (CVD), electroless deposition, electrodeposition and the like; annealing the structure at temperatures from about 200° to about 500° C. to form bamboo structures in line or a single crystal in short lines; and then planarizing the structure to remove the overburden and isolate the varies via structure.

Figure 6A:
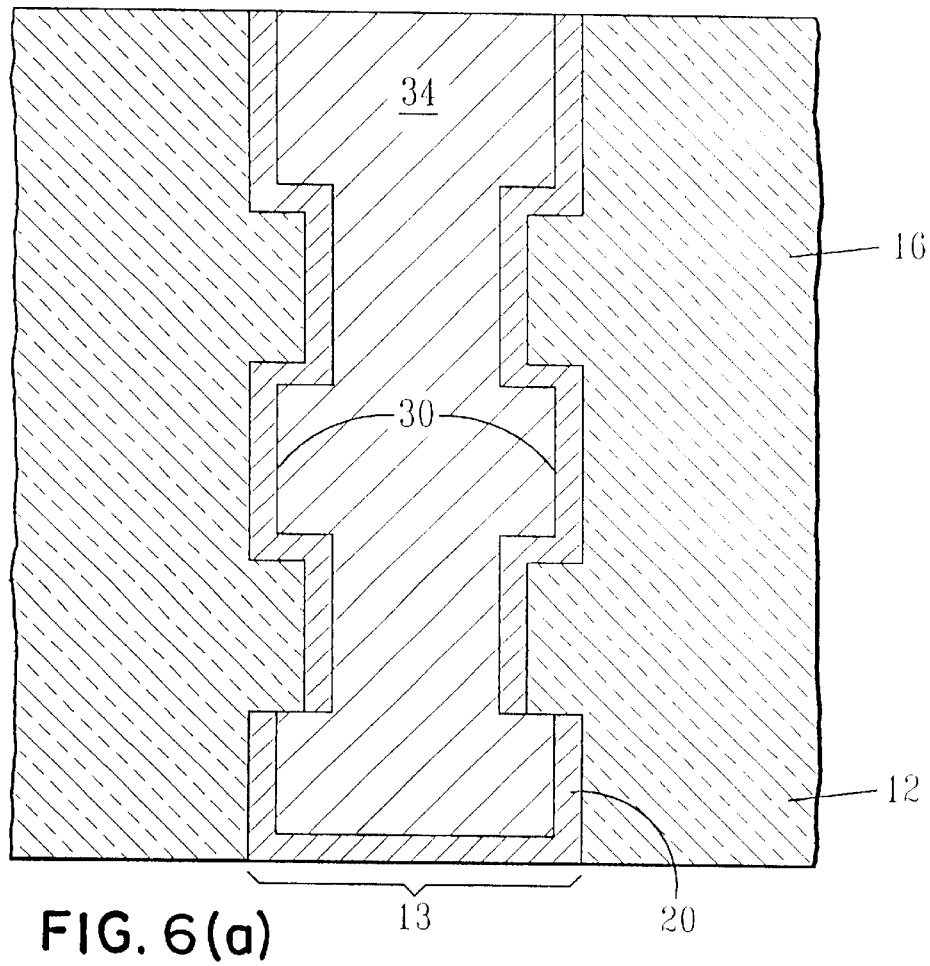
FIGS. 6(a)–(c) are cross-sectional views of a dual damascene structures without continuous metal-via-metal-via structure and without interlevel dielectrics containing (a) a continuous liner, (b) a discontinuous liner and (c) continuous liners in trenches and discontinuous lines in vias.
Figure 6B:
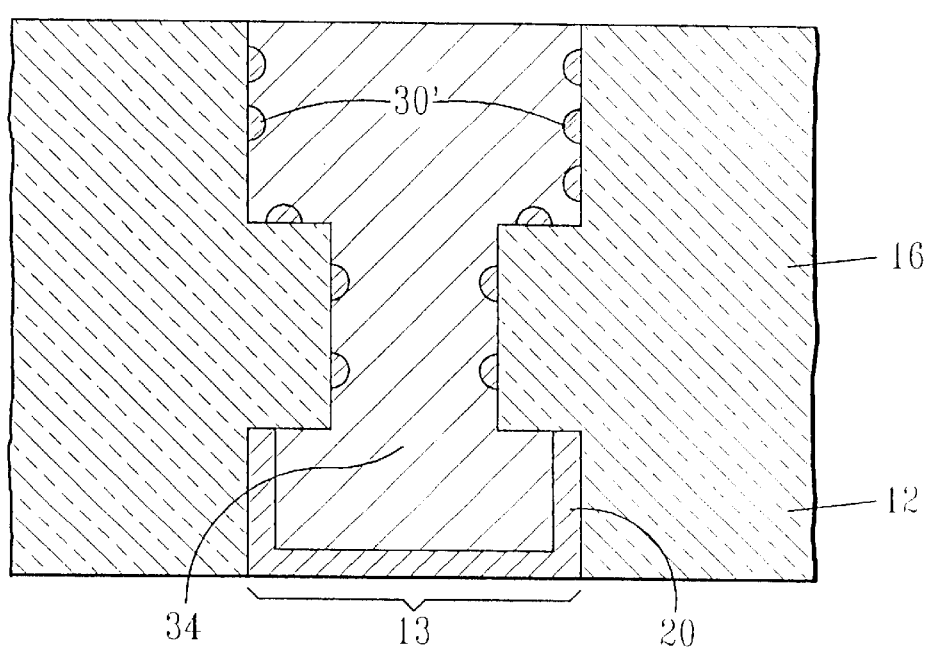

As stated above, an interlevel dielectric layer 14 may be deposited so as to separate via level 10a and metal level 10b using techniques well known to those skilled in the art. Examples of suitable techniques for depositing interlevel dielectric 14 include, but are not limited to, spin on dielectrics, CVD, physical vapor deposition (PVD) and ion implantation. Conventional dielectric materials including SiN, diamond like carbon and the like may be employed as interlevel dielectric layer 14. In one aspect of the present invention, no interlevel dielectrics are found in the wiring structure. This embodiment of the present invention is shown in FIGS. 6(a)–(b), for example.

Insulative layer 16, which may be composed of the same or different dielectric material as dielectric layer 14, is deposited onto the surface of interlevel dielectric 14. The deposition techniques employed in this stage of the present invention include the previously mentioned techniques used in forming interlevel dielectric layer 14. When no interlevel dielectric layer is employed, insulative layer 16 is deposited directly on metal level 10b.

Insulative layer 16 is then patterned using conventional lithographic techniques well known to those skilled in the art. Suitable techniques include providing a resist to insulative layer 16; removing those portions of insulative layer 16 not covered by the resist, stopping at interlevel dielectric 14; stripping the resist; and then etching the unexposed interlevel dielectric material.

The insulative material and the interlevel dielectric material may be removed using etching techniques well known to those skilled in the art. For example, the insulative material and the interlevel dielectric material may be removed by utilizing a dry etch. When dry etching is employed, reactive ion etching (RIE), ion beam etching (IBE) or plasma etching may be utilized. Of these dry etching techniques, it is preferred that RIE be employed.

Figure 5:
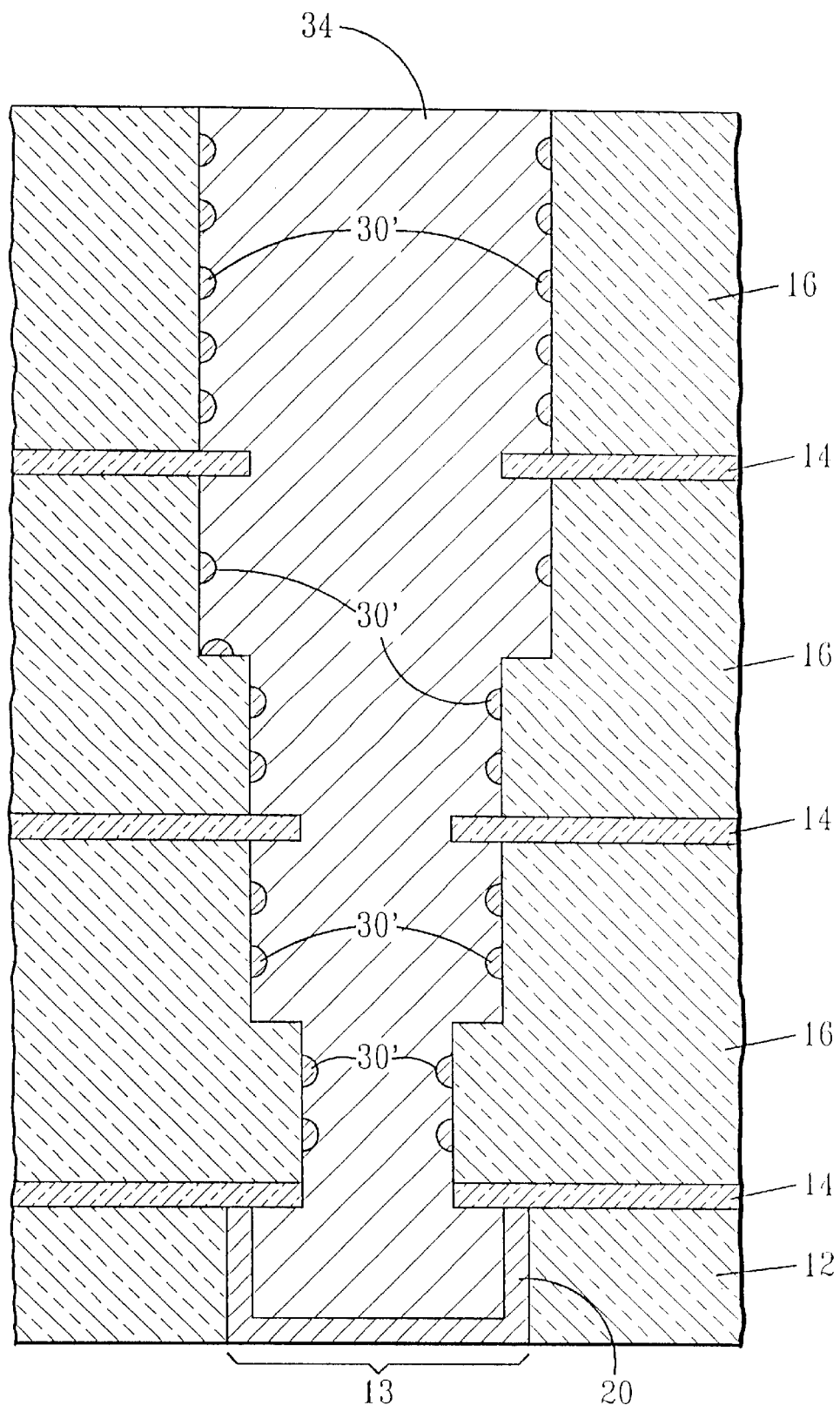
FIG. 5 is a cross-sectional view of a multi-level wiring structure containing multiple overhanging interlevel dielectric layers separating each line-via-line portion of the structure.

It should be stated that the above etching techniques may be used to completely remove the interlevel dielectric layer or, in one embodiment of the present invention, the etching leaves some of the exposed interlevel dielectric behind providing an overhang which prevents or suppresses metallic material slide on the vertical regions of the sidewalls of the via. The overhang can be provided using selective etching or by other means well known in the art. That embodiment of the present invention is shown in FIG. 5.

Next, a second liner 30 is then sputter deposited onto insulative layer 16 as well as the sidewalls of via 18. Any method known in the art can be used, but the present invention used the apparatus and conditions described in copending application, U.S. Ser. No. 08/767,572, filed on Dec. 16, 1996. Specifically, the sputter deposition is conducted using a Rf bias such that deposition of liner 30 occurs on insulative layer 16 and on the sidewalls of via 18. Typically, in the present invention the sputter deposition is conducted using a Rf bias which is active for at least 18% of the total deposition time. More preferably, the sputter deposition biasing is active for a minimum of about 25% and a maximum of about 50% of the total sputter deposition time. It is noted that under the above conditions no deposition occurs at the bottom of via 18.

Figure 6C:
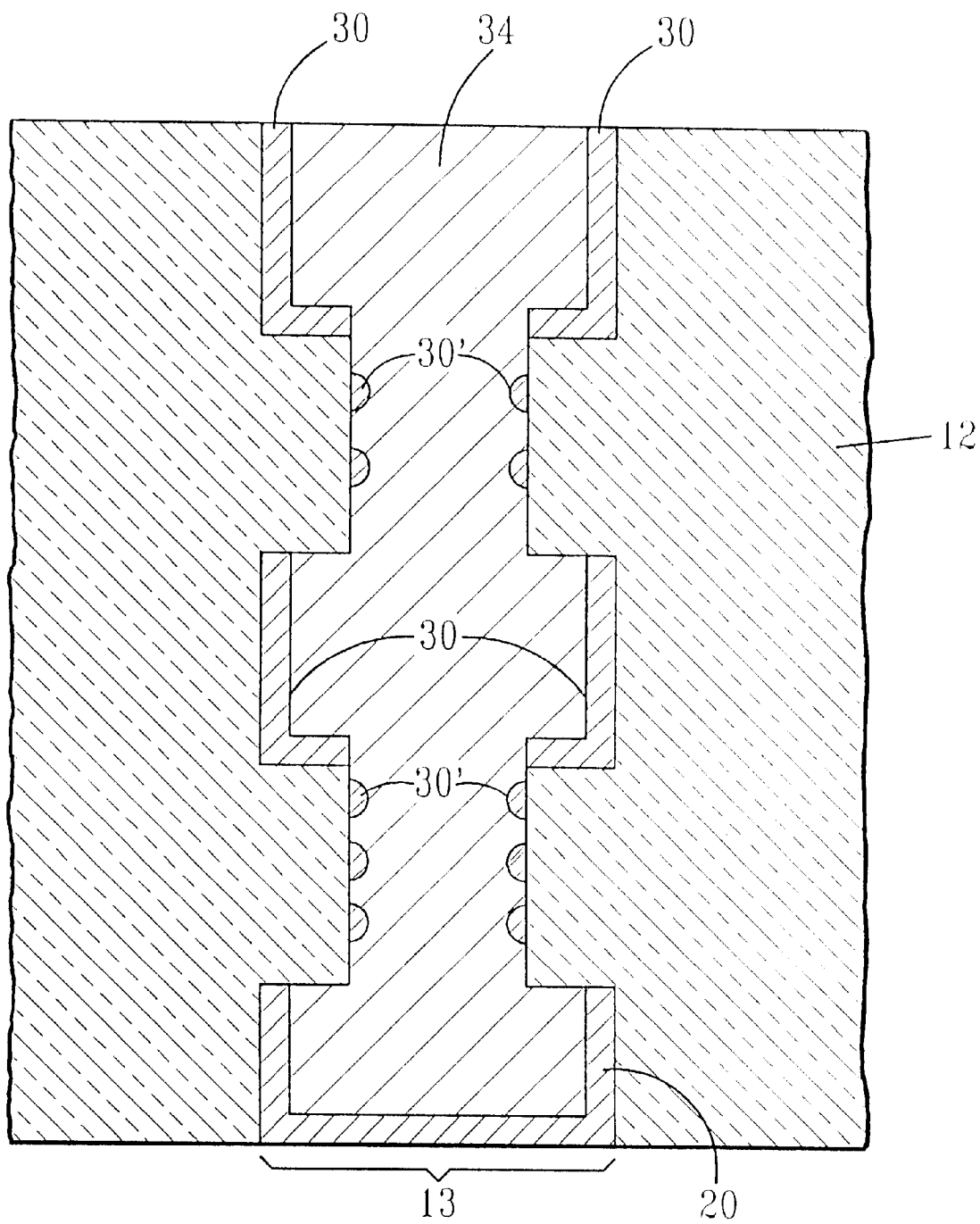

As is the case with liner 20, liner 30 may be a continuous liner covering all of the sidewalls of via 18 or it may be a discontinuous liner 30' cover only portions of the sidewalls of via 18. Liner 30 may be the same or different from liner 20. Suitable materials for liner 30 or 30' are the same as those mentioned hereinabove for liner 20. Discontinuous liners 30' are shown in FIGS. 3, 4(b), 5 and 6(b). The present invention also contemplates the use of wiring structures which contain continuous liners 30 and discontinuous liners 30' in the same structure. That embodiment of the present invention is illustrated in FIGS. 4(c) and 6(c).

After depositing liner 30, a conductive material layer 32 may be deposited on the surface of liner 30 using conventional techniques well known to those skilled in the art. Conductive layer 32 may be the same or different from trench material 22; however, it is preferred if both regions are composed of the same material. A highly preferred conductive material employed in the present invention is Cu. Depending on the device being manufactured, a seed layer of conductive layer 32 may be deposited.

Next, the open-bottomed via is filled with metal layer 34 to provide a line structure. The metal layer is typically composed of the same material as the conductive layer, with Cu being most preferred. Metal line layer 34 can be formed by the above mentioned deposition techniques or by suitable plating techniques.

In one embodiment of the present invention, the above structure is encapsulated by depositing a metal such as Ta, TaN, TiN and the like onto the surface of the structure. Diamond-like carbon may also be used in the present invention to encapsulate the structure.

Metal layer 34 or the encapsulated structure is then subjected to annealing under conditions which are effective in providing a continuous, single crystalline or polycrystalline conductive material extending through the lines and vias of the structure. Typically, annealing is conducted in $N_2$, $H_2$, a forming gas, i.e. a $H_2$ and $N_2$ mixture, or inert gas atmosphere at temperatures of from about 200° to about 400° C. for a time period of from about 1 to about 60 mins. More preferably, annealing is conducted at temperatures of from about 275° to about 325° C. for a time period of from about 5 to about 30 mins.

After annealing the structure shown in FIG. 2(b), it is then planarized using techniques well known to those skilled in the art including RIE and chemical mechanical polishing. The final wiring structure is shown in FIG. 2(c), wherein a continuous, single crystalline or polycrystalline line-via-line connection is obtained as evidenced by the continuous twin boundary running between the metal line and via.

In another embodiment of the present invention, the annealing step may be omitted. This embodiment is typically carried out when multi-level wiring structures are desired. When this embodiment is practiced, the deposition conditions used in forming the varies levels of the wiring structure are sufficient to cause annealing of the conductive regions.

It should be noted that the various steps of the present invention may be repeated a number of times providing a multi-level wiring structure such as shown in FIGS. 4–6. In those structures, the various metal levels are fabricated using techniques well known to those skilled in the art. This includes providing an interlevel dielectric layer to the top of the structure shown in FIG. 2(c), depositing an insulative layer thereon, patterning a trench in the insulative layer; remove portions of the dielectric layer thus provided, stripping the resist, providing a fresh resist, open a via, RIE the via stopping at the interlevel dielectric, and opening the interlevel dielectric layer. For a complete discussion of this process, see, for example, U.S. Pat. No. 4,789,648 to Charles, et al., the contents of which are incorporated herein by reference.

Figure 3:
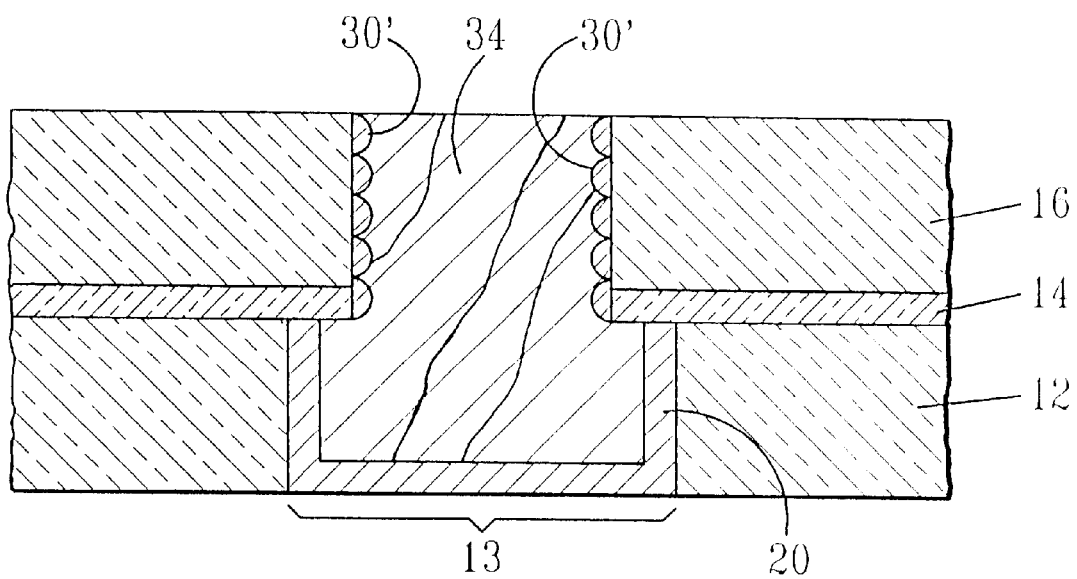
FIG. 3 is a cross-sectional view of a wiring structure prepared in accordance with the present invention having a discontinuous liner in the via.
Figure 4A:
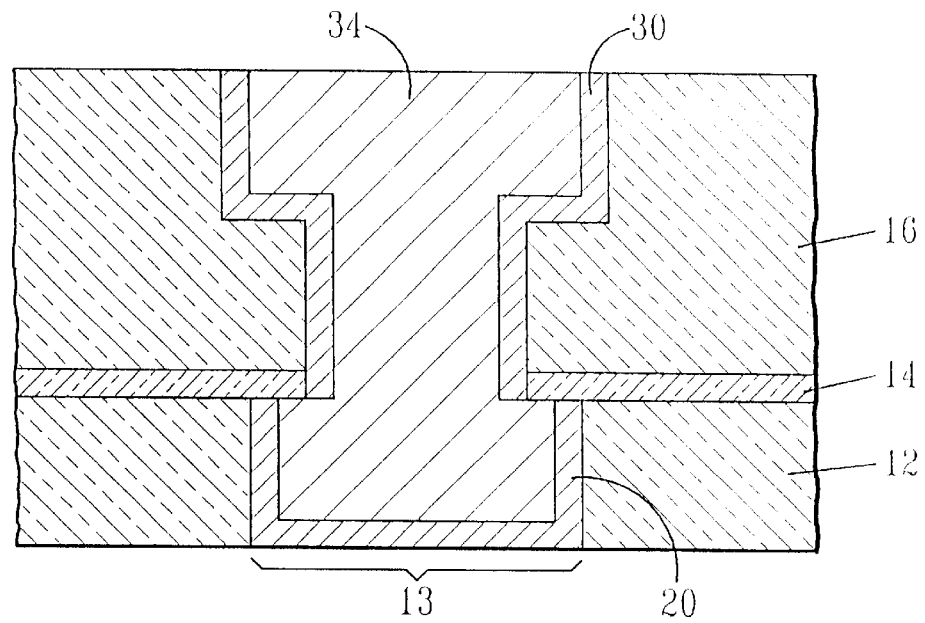
FIGS. 4(a)–(c) are cross-sectional views of dual damascene wiring structures prepared in accordance with the present invention using (a) a continuous liner, (b) a discontinuous adhesion layer as the liner material and (c) continuous liners on the sidewalls of trenches and discontinuous liners on the sidewalls of the vias.
Figure 4B:
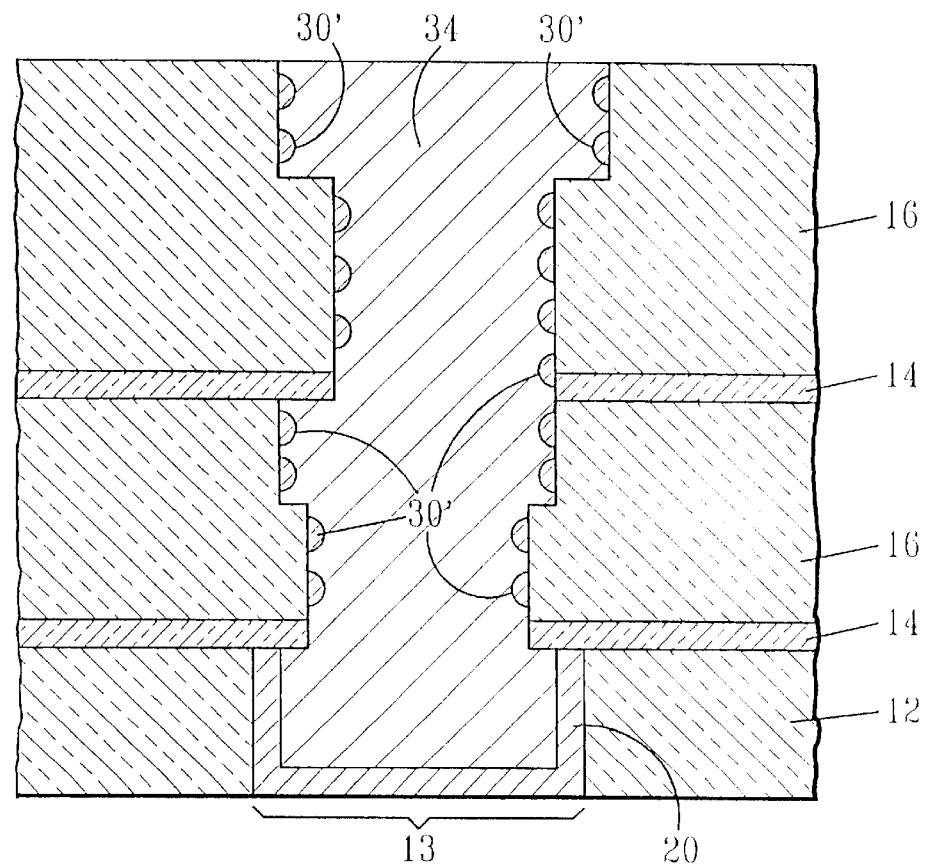
Figure 4C:
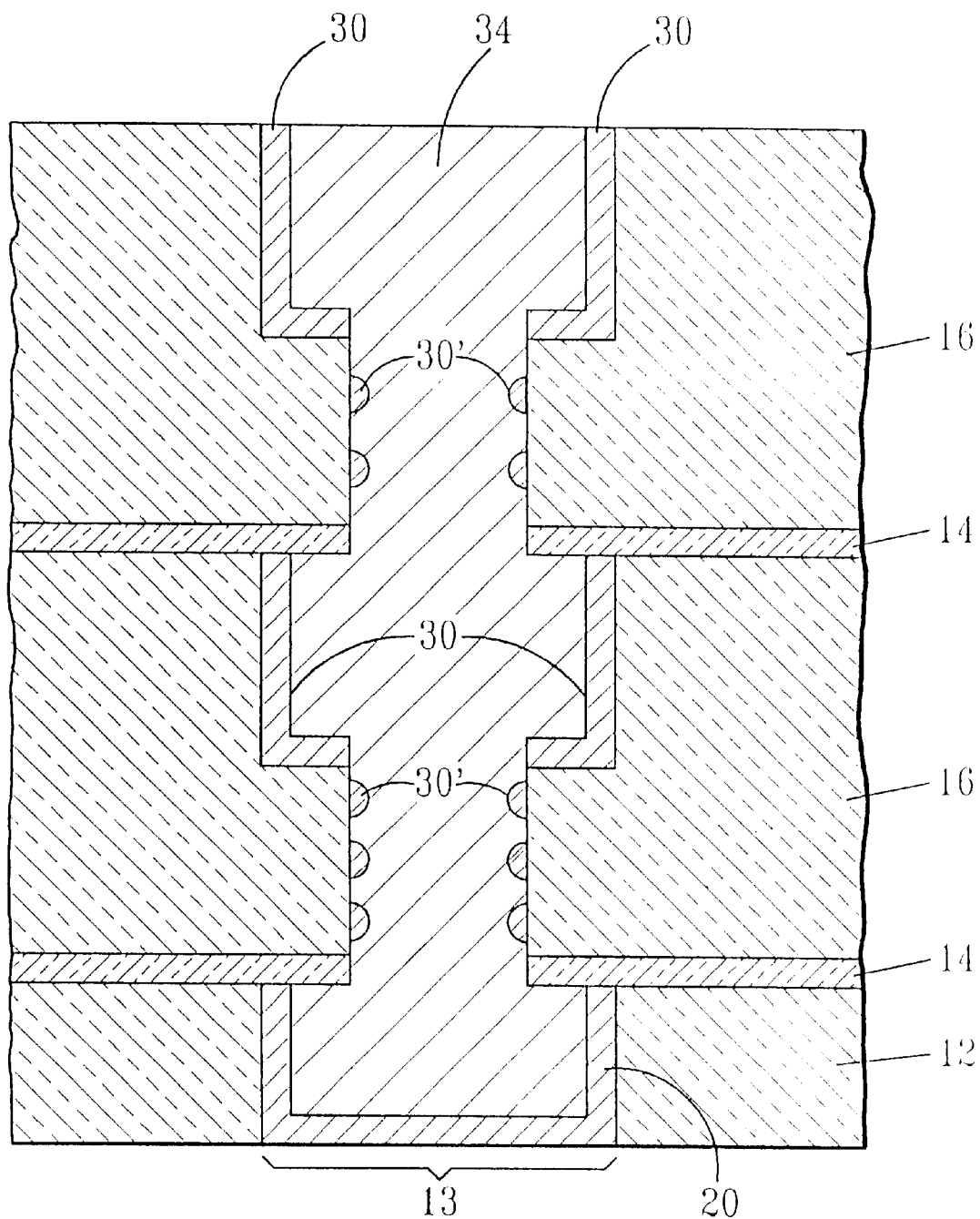

Other embodiments of the present invention prepared using the above described method are shown in FIGS. 3–6. Specifically, FIG. 3 represents a wiring structure which is prepared using discontinuous liners 30'; FIGS. 4(a)–(c) represent dual damascene wiring structures which are fabricated using a continuous liner 30, discontinuous liner 30' and a combination of continuous and discontinuous liners 30', respectively; FIG. 5 represents a multi-level wiring structure which contains overhangs of interlevel dielectric material 14; and FIGS. 6(a)–(c) represents dual damascene structures which do not contain any interlevel dielectrics separating the various levels of the wiring structure. In FIG. 6(a), a continuous liner 30 is employed, in FIG. 6(b), a discontinuous liner 30' is employed and, in FIG. 6(c) a combination of liners 30 and 30', i.e. continuous and discontinuous are employed. These structures are fabricated using conventional lithography and RIE techniques as mentioned hereinabove.

It should be noted that the dual damascene structures shown in FIGS. 4(a)–(c) are obtained by depositing a thin liner having a thickness of from about 5 to about 100 Å.

It is again emphasized that the method of the present invention provides a continuous, crystalline or polycrystalline conductive microstructure running between lines and vias of a wiring structure such that an extremely low or relatively non-existent contact resistance is observed, i.e. no interface between the metal levels and the via levels is present.

While the invention has been particularly shown and described with respect to preferred embodiments thereof, it will be understood by those skilled in the art that the foregoing and other changes in form and details may be make therein without departing from the spirit and scope of the instant invention.

Having thus described our invention, what we claim as new, and desire to secure by Letters Patent is:

1. A wiring structure comprising an electronic device containing at least one via level and at least one metal level, wherein said via level is on top of said metal level, and said levels are interconnected by a continuous polycrystalline conductive material having at least one twin boundaries.

2. The wiring structure of claim 1 wherein said continuous, single crystalline or polycrystalline material is composed of Cu.

3. The wiring structure of claim 1 wherein said electronic device is a damascene or non-damascene device.

4. The wiring structure of claim 1 wherein said metal level comprises at least one insulative portion and at least one metal line.

5. The wiring structure of claim 1 wherein said via level comprises at least one via and an insulative material.

6. The wiring structure of claim 1 wherein an interlevel dielectric separates said metal level and said via level.

7. The wiring structure of claim 4 wherein said metal line comprises a trench having a liner material on the sidewalls thereof.

8. The wiring structure of claim 7 wherein said liner material is a continuous liner or a discontinuous liner.

9. The wiring structure of claim 1 wherein said continuous polycrystalline material is composed of Cu, Al, Ag, Cr, Au, Ni, W or alloys thereof.

10. A multi-level wiring structure comprising an electronic device containing two or more metal levels and two or more via levels, wherein each metal level is separated by a via level and said levels are interconnected by a continuous polycrystalline conductive material having at least one twin boundaries.

11. The multi-level wiring structure of claim 10 wherein said continuous, single crystalline or polycrystalline conductive material is Cu.

12. The multi-level wiring structure of claim 10 wherein said metal levels comprise at least one insulative portion and at least one metal line.

13. The multi-level wiring structure of claim 10 wherein said via levels comprise at least one via and an insulative material.

14. The multi-level wiring structure of claim 10 wherein an interlevel dielectric separates said metal levels and said via levels.

15. The multi-level wiring structure of claim 12 wherein said metal line comprises a trench having a liner material on the sidewalls thereof.

16. The multi-level wiring structure of claim 15 wherein said liner material is a continuous liner or a discontinuous liner.

17. The multi-level wiring structure of claim 10 wherein said continuous polycrystalline material is composed of Cu, Al, Ag, Cr, Au, Ni, W or alloys thereof.

* * * * *